United States Patent [19]
McGinn

[11] Patent Number: 4,757,280
[45] Date of Patent: Jul. 12, 1988

[54] NPN TRANSISTOR RC OSCILLATOR

[75] Inventor: Michael McGinn, Scottsdale, Ariz.

[73] Assignee: Motorola, Inc., Schaumburg, Ill.

[21] Appl. No.: 136,328

[22] Filed: Dec. 22, 1987

[51] Int. Cl.$^4$ ............................................. H03K 3/26
[52] U.S. Cl. .................................... 331/111; 328/188
[58] Field of Search .................. 331/108 R, 111, 143, 331/177 V; 358/159; 328/181

[56] References Cited

U.S. PATENT DOCUMENTS 4,415,869 11/1983 Duijkers ............................. 331/111
4,670,721 6/1987 Gontowsk, Jr. et al. ....... 331/111 X

OTHER PUBLICATIONS

Smith, Versatile Triangle Wave Generator, Wireless World, Feb. 1973, vol. 79, No. 1448, pp. 87-89.

*Primary Examiner*—Eugene R. LaRoche
*Assistant Examiner*—Robert J. Pascal
*Attorney, Agent, or Firm*—Michael D. Bingham

[57] ABSTRACT

An oscillator is disclosed which comprises a current source for supplying currents at respective outputs; a capacitor coupled between first and second ones of the outputs of the current source which is charged and discharged between upper and lower voltage thresholds; a comparator for supplying a switching control signal at an output responsive to the capacitor being charged and discharged to the upper and lower voltage thresholds, the comparator having a first input to which is supplied a reference voltage and a second input coupled to the first output of the current source and including a first switchable gain current mirror the gain of which is at a first value whenever the capacitor is being charged and is at a second lower value whenever the capacitor is being discharged, the first current mirror having a control terminal; a second switchable gain current mirror which is coupled between the first and second outputs of the current source and having a control terminal the gain of which is at a first value whenever the capacitor is being charged and is at a second higher value whenever the capacitor is being discharged; and an NPN switching transistor which is operated between conducting and non-conducting states in response to the switching control signal for switching the gain values of the first and second current mirrors accordingly, the transistor having a base coupled to the output of the comparator and its collector-emitter conduction path coupled to the control terminals of the first and second switchable gain current mirrors.

4 Claims, 1 Drawing Sheet

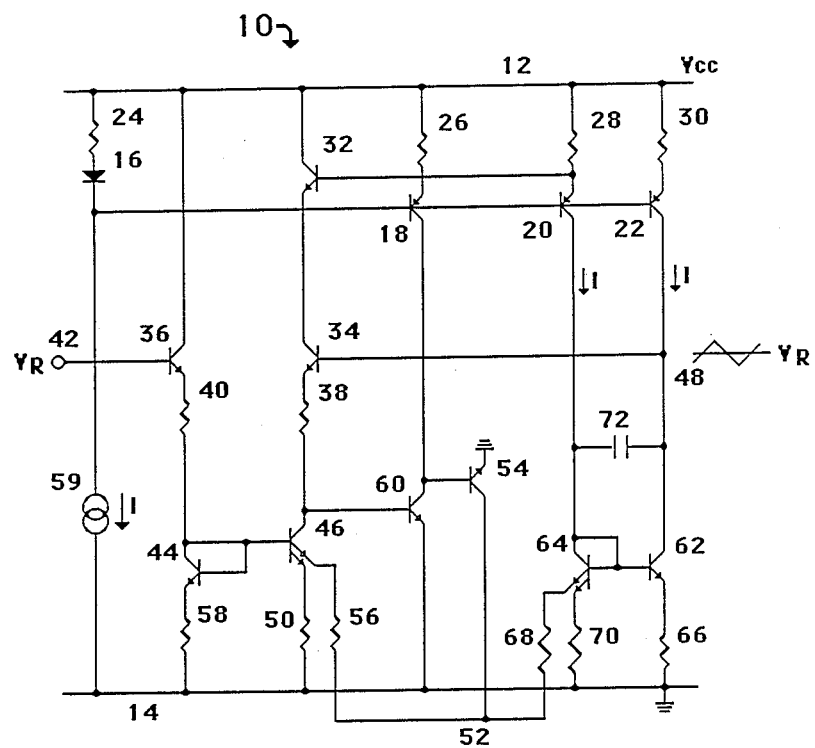

NPN TRANSISTOR RC OSCILLATOR

BACKGROUND OF THE INVENTION

The present invention relates to oscillators and, more particularly, to integrated RC oscillator circuits.

Most, if not all, prior art RC oscillators include a comparator having one input coupled to a resistor divider circuit for setting the threshold voltage level of the comparator, a capacitor usually coupled to the other input of the comparator and means for varying the threshold voltage of the comparator by varying the resistance of the divider circuit.

Typically, a PNP transistor is coupled to the output of the comparator which is switched between off and on states to change the threshold voltage level. In the off state a upper threshold voltage is established at the one input of the comparator, across the resistor divider, and a current source supplies current to charge the capacitor until the voltage thereacross reaches the upper threshold voltage. At this time the output of the comparator switches which turns on the PNP transistor. As the PNP transistor is switched on the resistance of the resistor divider is decreased, usually by shorting out a portion of the lower resistance of the divider, thereby establishing a lower threshold voltage at the one input of the comparator. The capacitor is then allowed to discharge to this lower threshold voltage at which time the PNP transistor is switched off as the output of the comparator is switched to its previous state. In this manner the capacitor is alternately charged and discharged. The output of the oscillator is usually provided from across the capacitor as is well understood.

A problem with the above described prior art oscillators is due to the fact that PNP transistors have notoriously slow switching characteristics. This characteristic limits the cycle time for charging and discharging the capacitor and, hence, the oscillation frequency of the oscillator.

Hence, a need exists for an RC type of oscillator that does not require a PNP switching transistor in order to provide high frequency oscillation signals.

SUMMARY OF THE INVENTION

Accordingly, it is an object of the present invention to provide an improved oscillator circuit.

Another object of the present invention is to provide an improved RC oscillator circuit.

Still another object of the present invention is to provide an improved integrated RC oscillator circuit.

Yet another object of the present invention is to provide an improved integrated RC oscillator which does not require switching a PNP transistor.

Still yet another object of the present invention is to provide an all NPN RC integrated oscillator circuit.

In accordance with the above and other objects there is provided an oscillator comprising a current source for supplying substantially constant currents at respective outputs; a capacitor coupled between first and second ones of said respective outputs of the current source, the capacitor being charged and discharged between an upper and a lower voltage threshold; a comparator for supplying a switching control signal at an output responsive to the capacitor being charged and discharged to the upper and lower voltage thresholds, the comparator having a first input to which is supplied a reference voltage and a second input coupled to the first output of the current source, the comparator including a first switchable gain current mirror circuit the gain of which is at a first value whenever the capacitor is being charged and is at a second lower value whenever the capacitor is being discharged, the first current mirror circuit having a control terminal; a second switchable gain current mirror circuit which is coupled between the first and second outputs of the current source and having a control terminal the gain of which is at a first value whenever the capacitor is being charged and is at a second higher value whenever the capacitor is being discharged; and an NPN switching transistor which is operated between conducting and non-conducting states in response to the switching control signal for switching the gain values of the first and second current mirror circuits accordingly, the transistor having a base coupled to the output of the comparator and its collector-emitter conduction path coupled to the control terminals of the first and second switchable gain current mirror circuits.

BRIEF DESCRIPTION OF THE DRAWING

The sole figure is a schematic diagram illustrating the oscillator of the preferred embodiment of the invention.

DETAILED DESCRIPTION OF THE PREFERRED EMBODIMENT

Turning now to the drawing there is shown RC oscillator 10 of the present invention which is suited to be manufactured in integrated circuit form. Oscillator 10 includes a pair of power supply conductors 12 and 14 to which a source of operating potential Vcc is applied. Multiple current sources comprising diode 16, non-switching PNP transistors 18, 20 and 22 and associated resistors 24, 26, 28 and 30 are provided for supplying substantially constant currents. The base electrodes of the non-switching PNP transistors are all interconnected to the cathode of diode 16 while the anode of the diode and the emitters of the PNP transistors are returned to power supply conductor 12 via the respective resistors. It is understood that any type of current supply could be used, for instance, resistors could be used in place of diode 16 and transistors 18, 20 and 22. NPN transistor 32 having its base and collector electrodes coupled to the emitter of transistor 32 and power supply conductor 12 respectively and its collector coupled to the collector of NPN transistor 34 supplies current to the latter. NPN transistors 34 and 36 which have their emitters coupled to a first current mirror circuit via respective resistors 38 and 40 form therewith a comparator circuit. The base of transistor 36 is adapted to receive a reference potential at input 42 while its collector is returned to power supply conductor 12. The base of transistor 34 is coupled to the collector of current supply transistor 30 at node 48. The first current mirror circuit includes transistor 44, connected as a diode by having its base and collector interconnected to the lower end of resistor 40, and transistor 46 connected in a conventional manner. Transistor 46 is a multiple emitter device having its collector coupled to the lower end of resistor 38 and a first emitter coupled via resistor 50 to power supply conductor 14 and the second emitter coupled at node 52 to the collector of NPN switching transistor 54 via resistor 56. The emitter of diode connected transistor 44 is returned to power supply conductor 14 via resistor 58. A constant current supply is coupled between the cathode of diode 16 and power supply conductor 14. Switching transistor 54 has its base coupled both to the collector of transistor 18 and the collector of NPN transistor 60 the latter of which has its base and emitter coupled respectively to the collector of transistor 46 and power supply conductor 14. A second current mirror circuit includes NPN transistor 62 and multiple emitter diode connected transistor 64. The collector-emitter conduction path of transistor 62 is coupled between node 48 and power supply conductor 14 via resistor 66. The first emitter of transistor 64 is coupled via resistor 70 to power supply conductor 14 while its second emitter is coupled via resistor 68 to node 52. As will be explained, the gain of the first and second current mirrors are switched between high and low values during the operation of the oscillator. Finally, capacitor 72, which is charged and discharged between upper and lower voltage levels is connected between the collectors of transistors 20 and 22.

As will be explained in detail hereinafter, capacitor 72 is alternately charged between an upper and a lower voltage threshold value depending upon the relative gains of the first and second current mirrors. The gains of these current mirrors are switched or varied from a value greater than 1 to a value less than 1 accordingly. For explanation purposes it will be assumed that oscillator 10 has been in operation with capacitor 72 being charged towards the upper voltage threshold. In this condition the magnitude of $V_R$ is greater than the magnitude of the voltage developed at node 48. Hence, transistor 36 is conducting harder than transistor 34 and the voltage drop across resistor 40 is greater than the voltage drop across resistor 38, assuming that these two resistors are of equal value. For the moment, assume that transistor 54 is conducting such that node 52 is at ground potential. This causes the gain of the first current mirror comprising diode connected transistor 44 and transistor 46 to be greater than one. Since the current supplied to transistor 46 is less than supplied to diode transistor 44 the former will be in saturation which inhibits the conduction of transistor 60. Transistor 54 is therefore biased on as transistor 60 is turned off as was assumed. Thus, with node 52 being at ground potential, the gain of the second current mirror is less than one as resistors 68 and 70 are essentially in parallel. This causes transistor 62 to want to sink less current than is supplied from current source transistor 22. An excess current is thus supplied to node 48 which flows through capacitor 72 and diode connected transistor 64 of the second current mirror. Hence, capacitor 72 will be charged as was initially assumed.

As capacitor 72 is charged, the voltage at node 48 and the base of transistor 34 increases thereby turning the transistor on harder to source more current to transistor 46. When capacitor 72 is charged to the upper voltage threshold transistor 46 will be sinking all of the current that it requires by being bias by diode connected transistor 44. Excess current will then be available thereafter to transistor 60. Hence, the current flow through resistor 38 is compared to that flowing through resistor 40. When transistor 60 is turned on as capacitor 72 is charged to the upper voltage threshold value transistor 54 will be turned off. Node 52 will therefore no longer be at ground potential. This will cause the gain of the first current mirror to become less than one as resistors 50 and 56 are no longer in parallel while the gain of the second current mirror increases to greater than one since resistors 68 and 70 are also no longer in parallel. Thus, transistor 62 will now want to sink more current than is supplied from transistor 22. Capacitor 72 will therefore be discharged to supply the excess current required by transistor 62. Capacitor 72 will continue to be discharged with the voltage at node 48 decreasing accordingly until such time as the current supplied by transistor 34 is reduced to the value required by transistor 46 which is less since the current mirror has a gain less than one. At this time the capacitor has been discharged to the lower voltage threshold and excess current is no longer available to the base of transistor 60. Transistor 60 will then be turned off which allows transistor 54 to turn on. When transistor 54 turns on node 52 is again returned to ground potential and the gain of the first current mirror becomes greater than one while the gain of the second current mirror becomes less than one. Capacitor 72 then begins to be charged as described above. Thus, capacitor 72 is alternately charged and discharged to produce a triangular output voltage waveform as is seen at node 48. The output voltage is symmetrical about a dc potential equal to $V_R$ and can be varied by varying the value of $V_R$.

Hence, what has been described above is a novel NPN transistor oscillator that does not require the switching of any PNP transistor.

I claim:

1. An oscillator, comprising:
   current source means for supplying substantially constant currents at respective outputs;
   capacitive means coupled between first and second ones of said respective outputs of said current source means, said capacitive means being charged and discharged between an upper and a lower voltage threshold;
   a comparator for supplying a switching control signal at an output responsive to said capacitive means being charged and discharged to said upper and lower voltage thresholds, said comparator having a first input to which is supplied a reference voltage and a second input coupled to said first output of said current source means, said comparator including a first switchable gain current mirror circuit the gain of which is at a first value whenever said capacitive means is being charged and is at a second lower value whenever said capacitive means is being discharged, said first current mirror circuit having a control terminal;
   a second switchable gain current mirror circuit which is coupled between said first and second outputs of said current source means and having a control terminal the gain of which is at a first value whenever said capacitive means is being charged and is at a second higher value whenever said capacitive means is being discharged; and
   an NPN switching transistor which is operated between conducting and non-conducting states in response to said switching control signal for switching said gain values of said first and second current mirror circuits accordingly, said transistor having a base coupled to said output of said comparator and its collector-emitter conduction path coupled to said control terminals of said first and second switchable gain current mirror circuits.

2. The oscillator of claim 1 wherein said comparator includes:
   a first transistor having a control electrode coupled to said first input, a first electrode and a second electrode, said second electrode being coupled to a first power supply conductor;

a second transistor having a control electrode coupled to said second input, a first electrode and a second electrode, said second electrode being coupled to said first power supply conductor; and said first current mirror circuit being coupled to between said first electrodes of said first and second transistors.

3. The oscillator of claim 2 wherein said comparator includes:

a first resistor coupled to said first electrode of said first transistor at a first end thereof;

said first current mirror circuit comprising a diode means coupled between a second end of said first resistor and a second power supply conductor, and a third transistor having a control electrode, first, second and third electrodes, said control electrode being coupled to said second end of said first resistor;

a second resistor coupled between said first electrode of said second transistor and said third electrode of said third transistor;

a third resistor coupled between said first electrode of said third transistor and said second power supply; and a fourth resistor coupled between said second electrode of said third transistor and said control terminal of said first current mirror circuit.

4. The oscillator of claim 3 wherein said second current mirror circuit includes:

a first transistor having a control electrode, first and second electrodes, said first electrode being coupled to said second power supply conductor, said second electrode being coupled to said first output of said current source means, and said control electrode being coupled to said second output of said current source means;

a second transistor having a control electrode, first, second and third electrodes, said control and third electrodes being coupled to said second output of said current source means;

a first resistor coupled between said second electrode of said second transistor of said second current mirror circuit and said second power supply conductor; and a second resistor coupled between said first electrode of said second transistor of said second current mirror circuit and said control terminal thereof.

* * * * *